United States Patent
Roberts et al.

(10) Patent No.: US 6,802,654 B1
(45) Date of Patent: Oct. 12, 2004

(54) ELECTRICAL CONNECTOR FOR OPTO-ELECTRONIC MODULES

(75) Inventors: Bruce C. Roberts, San Jose, CA (US); Stephen A. Gee, Danville, CA (US); William P. Mazotti, San Martin, CA (US); Luu T. Nguyen, Sunnyvale, CA (US); Jia Liu, San Jose, CA (US); Peter Deane, Los Altos, CA (US); Ken Pham, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 219 days.

(21) Appl. No.: 10/119,619

(22) Filed: Apr. 9, 2002

Related U.S. Application Data
(60) Provisional application No. 60/331,338, filed on Nov. 20, 2001, provisional application No. 60/331,337, filed on Sep. 24, 2001, and provisional application No. 60/331,339, filed on Aug. 3, 2001.

(51) Int. Cl.[7] .................................................. G02B 6/36
(52) U.S. Cl. ........................................ 385/88; 385/92
(58) Field of Search ........................... 385/80, 88–94, 385/14, 76, 77, 78, 139, 49; 359/152, 154; 438/26, 27, 29, 31; 257/686, 777, 778, 723

(56) References Cited

U.S. PATENT DOCUMENTS

| | | | |
|---|---|---|---|
| 6,364,542 B1 | 4/2002 | Deane et al. | ................. 385/92 |
| 6,497,518 B1 * | 12/2002 | Deane | ......................... 385/92 |

OTHER PUBLICATIONS

U.S. patent application No. 09/568,558 by Nguyen et al., entitled "An Arrayable, Scaleable, and Stackable Molded Package Configuration", filed May 9, 2000.
U.S. patent application No. 09/713,367 by Deane, entitled "Miniature Opto–Electric Transceiver", filed Nov. 14, 2000.
U.S. patent application No. 09/922,357 by Nguyen et al., entitled "Optoelectronic Package with Dam Structure to Provide Fiber Standoff", filed Aug. 3, 2001.
U.S. patent application No. 09/922,358 by Nguyen et al., entitled "Miniature Semiconductor Package for Opto–electronic Devices", filed Aug. 3, 2001.
U.S. patent application No. 09/947,210 by Nguyen et al., entitled "Techniques for Joining an Opto–electronic Module to a Semiconductor Package", filed Sep. 4, 2001.
U.S. patent application No. 10/165,548 by Nguyen et al., entitled "Techniques for Attaching Rotated Photonic Devices to an Optical Sub–assembly in an Optoelectronic Package", filed Jun. 6, 2002.
U.S. patent application No. 10/165,553 by Mazotti et al., entitled "Optical Sub–assembly for Optoelectronic Modules", filed Jun. 6, 2002.
U.S. patent application No. 10/165,711 by Liu et al., entitled "Ceramic Optical Sub–assembly for Optoelectronic Modules", filed Jun. 6, 2002.

* cited by examiner

*Primary Examiner*—Karl D. Frech
(74) *Attorney, Agent, or Firm*—Beyer Weaver & Thomas LLP

(57) ABSTRACT

The invention comprises a connector apparatus for electrically interconnecting a chip sub-assembly to an optical sub-assembly. The apparatus includes a connector sleeve with a chip sub-assembly having at least one electrical connection arranged thereon. The connector sleeve is suitable for receiving a connector plug that includes an optical fiber optically coupled to the photonic devices of an optical sub-assembly that includes electrical connectors. The connector plug is engaged with the connector sleeve, thereby electrically interconnecting the electrical connections of the chip sub-assembly to the electrical connectors of the optical sub-assembly such that electrical signals can pass between the chip sub-assembly and a photonic device of the optical sub-assembly.

21 Claims, 4 Drawing Sheets

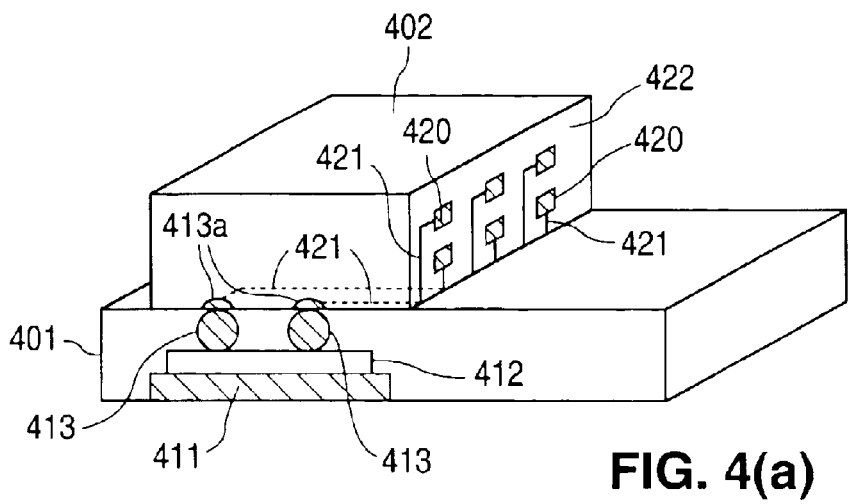
FIG. 4(a)
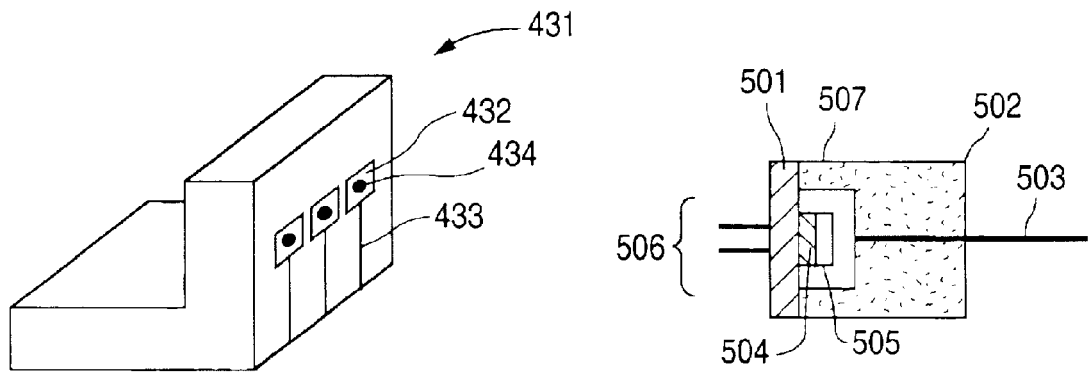
FIG. 4(b)
FIG. 5(a)
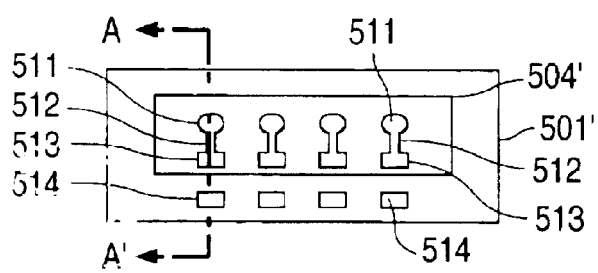
FIG. 5(b)
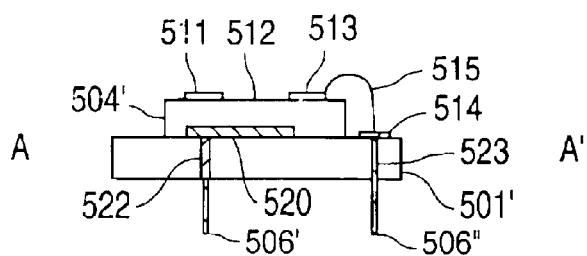
FIG. 5(c)

ELECTRICAL CONNECTOR FOR OPTO-ELECTRONIC MODULES

CROSS-REFERENCE TO RELATED APPLICATIONS

This application is related to the following U.S. Patent documents:

U.S. patent application Ser. No. 09/568,094, entitled "Device And Method For Providing A True Semiconductor Die To External Fiber Optic Cable Connection," by Deane et al., filed on May 9, 2000;

U.S. patent application Ser. No. 09/568,558, entitled "Arrayable, Scalable And Stackable Molded Package Configuration," by Nguyen et al., filed on May 9, 2000;

U.S. patent application Ser. No. 09/713,367, entitled "Miniature Opto-Electric Transceiver," by Peter Deane, filed on Nov. 14, 2000;

U.S. patent application Ser. No. 09/922,358, entitled "Miniature Semiconductor Package For Opto-Electronic Devices," by Nguyen et al., filed on Aug. 3, 2001;

U.S. patent application Ser. No. 09/947,210, entitled "Techniques For Joining An Opto-Electronic Module To A Semiconductor Package," by Nguyen et al., filed on Sep. 4, 2001;

U.S. patent application Ser. No. 09/922,357, entitled "Optoelectronic Package With Dam Structure To Provide Fiber Standoff", by Nguyen et al., filed on Aug. 3, 2001;

U.S. Provisional Patent Application No. 60/331,339, entitled "Optical Sub-Assembly For Opto-Electronic Modules," by Mazotti et al., filed on Aug. 3, 2001;

U.S. Provisional Patent Application No. 60/331,338, entitled "Ceramic Optical Sub-Assembly For Opto-Electronic Modules", by Liu et al., filed on Nov. 20, 2001; and to U.S. Provisional Patent Application No. 60/331,337, entitled: "Techniques For Attaching Rotated Photonic Devices To An Optical Sub-Assembly In An Optoelectronic Package", by Nguyen et al., filed on Sep. 24, 2001; the content of each of which are hereby incorporated by reference.

FIELD OF THE INVENTION

The invention described herein relates generally to opto-electric connectors.

BACKGROUND OF THE INVENTION

Due to increasing need for bandwidth, modem computer and communication networks are placing increasing reliance on optical signal transmission through fiber optic cabling. Fiber optic cabling is very efficient for transferring data as light signals. Unfortunately, there is still no efficient way to "store" or "process" light signals representative of data. Thus, current technologies still require the conversion of optical signals into electronic signals prior to processing by various electronic devices and components. Therefore, networks will likely continue using fiber optics for transmitting data between nodes and silicon chips to process the data within the nodes for the foreseeable future.

Fiber optic transceivers, which convert light signals from a fiber optic cable into electrical signals, and vice versa, are used as the interface between a fiber optic line and a computer node. A typical transceiver includes one or more opto-electric semiconductor devices. Such opto-electric semiconductor devices can include optical receivers (optical detectors for converting light signals received over the fiber optic cables into electrical signals) and/or optical emitters (e.g. lasers) for converting electrical signals from the semiconductor devices into light signals. A number of fiber optic transceivers are commercially available from a variety of sources including Hewlett Packard, AMP, Sunitomo, Nortel, and Siemens.

In one known implementation, one or more optical transceivers are mounted directly onto a microprocessor or other electronic chip package. Optical fibers are optically connected and aligned with the transceivers using a connector apparatus. Such connections can be effective in transferring and converting optical signals into electronic signals (and vice versa). FIGS. 1 and 2 are simplified illustrations of one such approach. FIG. 1 shows a connector sleeve 10 having a chip-sub-assembly (CSA) 11 mounted thereon. Additionally, the chip-sub-assembly (CSA) 11 is mounted to a circuit board (not shown). An optical block 12 is mounted on top of the CSA 11. Photonic devices 13 are formed on the optical block 12. The photonic devices 13 are electrically connected to the CSA 11 using electrical connections formed on the optical block 12. Also, an optical fiber 17 is held by a ferrule 16. To connect the fiber 17 with the photonic device 13 (and thereby the CSA 11) the ferrule 16 is inserted (indicated by the arrow) into the sleeve 10. Referring to FIG. 2, the ferrule 16 is shown fully engaged with the sleeve 10 (contacting spacer 14) thereby aligning the fiber 17 with the photonic device 13. Thus, the interconnection of ferrule 16 with the sleeve optically aligns the fibers 17 with corresponding photonic devices 13. Typical examples of such devices are described in the above-referenced U.S. Patent Applications and U.S. Provisional Patent Applications.

One of the shortcomings of such implementations is that many of the connector components must be manufactured to relatively high tolerances in order to achieve the required optical alignment when the components are connected. Because the fiber is in one component and the photonic device is in another component, and due to the relatively precise nature of the optical connection between the fiber and photonic device, each time the connector components are connected there can be some uncertainty in the optical alignment. This has the effect of reducing the overall reliability of the connection. When subject to mechanical and environmental stresses during use, the connection can become misaligned.

Reflow temperatures can pose certain problems during the fabrication of optical components. To improve optical performance, lenses are commonly mounted on the photonic devices during manufacture. Such lenses are commonly constructed of plastics or other related materials. Such materials can become deformed at relatively low temperatures. During reflow processes (such as lead reflow processes used in leadless lead frame connection processes), lenses and other optical components can become damaged. This will become more of a problem as the industry moves away from lead processes (for environmental and other reasons, there is an increasing use of so-called "lead-less" processing) to other materials such as copper, tin, or other materials that require even higher process temperatures. Thus, developing a structure where the photonic devices and lenses are not subjected to these high temperatures is attractive.

SUMMARY OF THE INVENTION

Embodiments of the present invention include a variety of arrangements for electrically connecting a chip subassembly to electrical connections of photonic devices arranged on a separate optical sub-assembly.

In one aspect of the invention, a connector sleeve is provided that is suitable for receiving a connector plug, the connector plug having mounted thereon an optical fiber optically coupled to a photonic device with electrical connectors. The connector sleeve carries a chip sub-assembly with electrical connections for electrically connecting the chip sub-assembly to the optical sub-assembly when the connector plug is engaged with the connector sleeve.

In another aspect of the invention, a connector plug is provided that is suitable for engagement with a connector sleeve containing a chip sub-assembly. The connector plug includes an optical sub-assembly having photonic devices optically coupled to corresponding optical fibers and electrical connectors connected to the photonic devices. The electrical connectors are arranged such that an electrical connection is made between the photonic devices and the chip sub-assembly when the connector plug is engaged with the connector sleeve.

Another embodiment of the invention comprises a connector apparatus for electrically interconnecting a chip sub-assembly to an optical sub-assembly. The apparatus includes a connector sleeve and a connector plug. The connector sleeve is suitable for receiving the connector plug and has a chip sub-assembly with at least one electrical connection arranged thereon. The connector plug is suitable for engagement with the connector sleeve and contains an optical fiber, an optical sub-assembly including a photonic device that is optically coupled to the optical fiber, and electrical connectors corresponding to each photonic device. The connector plug is engaged with the connector sleeve, thereby electrically interconnecting the electrical connections of the chip sub-assembly to the electrical connectors of the optical sub-assembly such that electrical signals can pass between the chip sub-assembly and a photonic device of the optical sub-assembly.

Aspects of the invention also include a method for electrically interconnecting a chip sub-assembly to the photonic devices of an optical sub-assembly. The method comprises arranging a chip-sub-assembly having electrical connections on a connector sleeve configured to receive a connector plug and configuring a connector plug to include optical fibers and an optical sub-assembly having photonic devices with electrical connectors wherein the photonic devices are optically coupled to the photonic devices. The method including the further steps of engaging the connector plug with the connector sleeve so that the electrical connectors wherein the photonic devices are in electrical contact with the electrical connections of the chip-sub-assembly.

BRIEF DESCRIPTION OF THE DRAWINGS

The following detailed description will be more readily understood in conjunction with the accompanying drawings, in which:

FIG. 4(a) is a perspective view of one CSA embodiment with backing block in accordance with the principles of the present invention.

FIG. 4(b) is a perspective view a backing block embodiment constructed in accordance with the principles of the present invention.

FIGS. 5(a)–5(c) are various views of a connector plug embodiment including optical fiber and ferrule arrangement, photonic devices, other optical elements, and associated electrical connections constructed in accordance with the principles of the present invention.

It is to be understood that, in the drawings, like reference numerals designate like structural elements. Also, it is understood that the depictions in the figures are not necessarily to scale.

DETAILED DESCRIPTION OF THE INVENTION

The present invention is described with reference to a few embodiments, as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so as not to unnecessarily obscure the present invention.

The present invention pertains to a miniature form-factor connector for fiber optic modules. The connectors of the invention are used to connect an optical sub-assembly (having photonic devices) and optical fiber to a chip sub-assembly. As used herein, photonic devices refer to optical receivers or optical emitters (e.g., laser diodes). Connector embodiments of the invention facilitate the electrical connection of a plurality of photonic devices and their associated optical fibers to a chip sub-assembly. Commonly, the photonic devices form part of an optical sub-assembly (OSA). The OSA is an interface device for translating high-speed electrical data signals into optical data signals (and/or vice versa). In one embodiment, an optical sub-assembly contains a plurality of photonic devices and their associated electrical connectors. The photonic devices of the optical sub-assembly are optically coupled to a plurality of optical fibers. This combination of OSA and fiber is held by a connector plug.

In another component, a semiconductor chip is arranged in a semiconductor chip sub-assembly (CSA) having electrical connections. By electrically interconnecting the CSA with the OSA, electrical signals can be converted to optical signals and vice versa. The OSA can be used to form optical-electrical modules for transceiver, transmitter, and receiver applications. Such applications include, but are not limited to, chip-to-chip, board-to-board, chassis-to-chassis, and system-to-system inter-networking.

Figure 1:
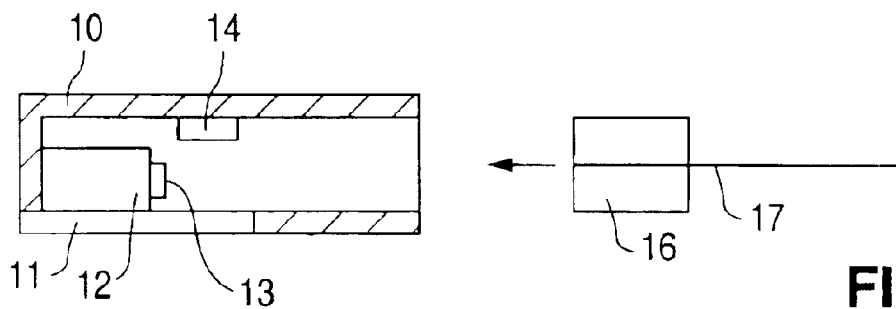
FIGS. 1 and 2 are simplified illustrations of a known type of opto-electric connector.
Figure 2:
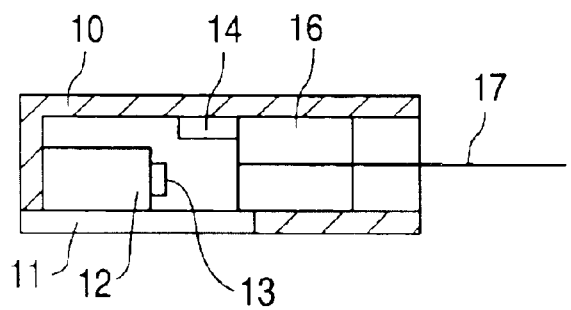
Figure 3A:
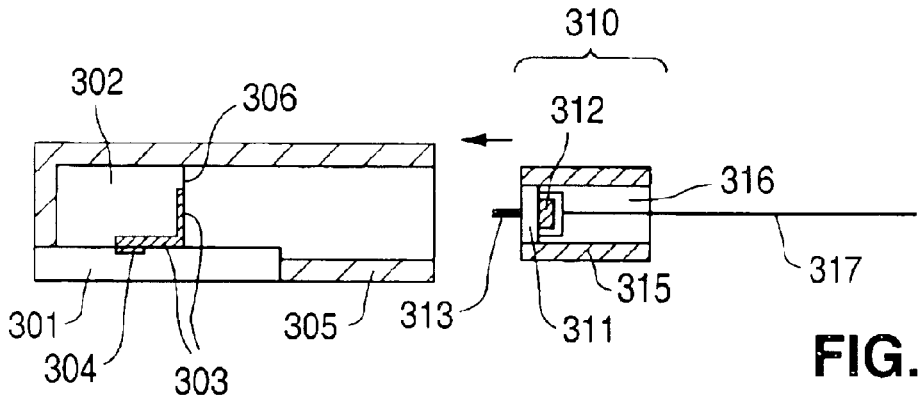
FIGS. 3(a) and 3(b) are section views of a simplified embodiment for a connector sleeve and connector plug for electrically interconnecting a CSA with photonic devices mounted on the connector plug in accordance with the principles of the present invention.

FIG. 3(a) is a simplified illustration of one embodiment of the invention. In the depicted embodiment, an apparatus for electrically interconnecting a chip sub-assembly (CSA) to photonic devices of an optical sub-assembly is shown. A CSA 301 can be formed of a variety of semiconductor chip packages that have electrical connection pathways for electrically connecting to photonic devices of optical sub-assemblies. For instance, the CSA 301 can be a leadless leadframe package (LLP) that has up-linking contact surfaces 304 (also referred to herein as electrical connections) that are exposed through the top surface of the LLP. In one implementation, the CSA 301 is mounted to a circuit board (not shown). The details of a suitable CSA formed from an LLP are disclosed in U.S. patent application Ser. No. 09/922,357, entitled "Optoelectronic Package with Dam Structure to Provide Fiber Standoff" which is hereby incorporated by reference.

In the depicted embodiment, the CSA 301 is arranged within a connector sleeve 305. Additionally, a backing block 302 is mounted onto the CSA 301. Electrical conduction pathways 303 are formed on the backing block 302. In the depicted embodiment, the conduction pathways 303 make electrical contact with the electrical connections 304 on top of the CSA 301. In one embodiment, the conduction pathways 303 lead to electrical contact pads on the front facing surface 306 of the backing block 302. Thus, the electrical connections 304 on top of the CSA 301 are electrically connected with electrical contact pads on the front facing surface 306 of the backing block 302.

The connector plug 310 includes an optical sub-assembly (OSA) comprising a support 311 having photonic devices 312 formed thereon. The support 311 further includes electrical connectors 313 that are electrically connected to the photonic devices 312. Optical fibers 317 are held by a ferrule 316. A wide range of electrical connectors 313 can be used to electrically connect to the photonic devices 312. Examples include, but are not limited to, simple metal contacts (e.g., solder balls and the like), spring loaded conducting pins (e.g., "pogo pins" (a trademark of Everett Charles Technologies)) or other electrical connectors. The optical fibers 317 are optically coupled with the photonic devices 312. Although not necessary to practice the invention, the OSA and ferrule can be mounted in a plug housing 315 that can facilitate the optical alignment of the fibers 317 with the photonic devices 312 and/or protect the optical components contained within. The OSA is electrically coupled to the CSA 301 by mechanically engaging the connector plug 310 with the connector sleeve 305 (as indicated by the arrow).

Figure 3B:
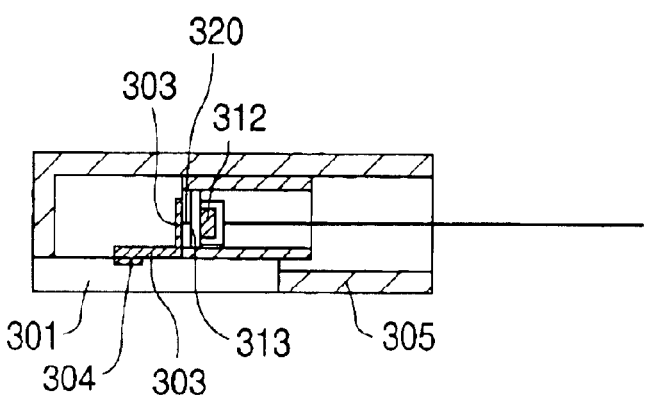

FIG. 3(b) shows a connector plug 310 engaged with a connector sleeve 305. The electrical interconnection 320 of the conduction pathways 303 to the electrical connectors 313 is shown. Thus, by engaging the connector plug 310 with the connector sleeve 305, the photonic devices 312 can be electrically connected to the CSA 301.

FIG. 4(a) is a simplified section view of an embodiment of a CSA 401 having an associated embodiment of a backing block 402 mounted thereon. The CSA 401 includes a semiconductor chip 412 mounted on a conductive die attach pad (DAP) 411. The chip 412 also includes up-linking electrical contacts 413 having contact surfaces 413a which can be used to form electrical connections to the backing block 402. The electrical contacts 413 can be formed in a variety of ways, for example, using solder balls.

The depicted backing block 402 is arranged on top of the CSA 401 with conduction pathways 421 formed on the facing surface 422 of the backing block 402. Additionally, the conduction pathways 421 (shown by the dashed lines) run underneath the backing block 402 where they electrically connect with the contact surfaces 413a of the CSA 401. Electrical contact pads 420 can be formed on the facing surface 422 of the backing block to facilitate easy electrical interconnection to the CSA 401. In one embodiment, the conduction pathways 421 are made by electrical contacts formed on a flexible circuitry tape mounted on the backing block 402. Alternatively, other methods of forming electrical contacts can be used. For example, etched metal leads can be used. The backing block 402 can be formed of a variety of materials including, but not limited to, polyethylene ether ketone (PEEK), liquid crystal polymer (LCP), polyphenylene sulfide (PPS) or ceramic (e.g., $Al_2O_3$). Although depicted here as a solid cubical shape, the backing block 402 can be configured in any shape that provides suitable electrical contact between the CSA 401 and photonic devices of a connector plug.

FIG. 4(b) is another embodiment of a backing block 431. The depicted embodiment 431 is L-shaped rather than the previously depicted "cubical" configurations. The contact pads 432 and their associated conduction pathways are also shown. The contact pads 432 of this embodiment include alignment openings 434 which penetrate into the backing block 431. The alignment openings 434 are configured to receive electrical contact pins positioned on the connector plug. Thus, as the connector plug is engaged with the connector sleeve, the contact pins serve as both electrical connectors and as alignment aids that assist in the alignment and electrical connection of the CSA 401 with the connector plug. One of the advantages of embodiments like those in FIGS. 4(a) and 4(b) (and elsewhere in the specification) is that the CSA and backing block contain no fragile optical components. Thus reflow processes can safely be used to manufacture these components and affix such components to circuit boards without damaging delicate lenses or other fragile optical components.

5(a), 5(b), and 5(c) depict various embodiments of an optical sub-assembly and related components. FIG. 5(a) is a cross-section view of an optical sub-assembly embodiment showing a support 501 having photonic devices 504 formed on one side and electrical connectors 506 on another side. The photonic devices 504 are electrically connected to electrical connectors 506. In the depicted embodiment an optical element 505 is mounted on the photonic device 504. Such optical elements 505 include, but are not limited to, lenses, filters, collimators, beam splitters, or other optical elements. The inventors specifically contemplate that the photonic devices and optical elements can comprise arrays of such devices or elements. Moreover, it is contemplated that embodiments of the invention can be practiced without the optical elements. Arranged with the optical sub-assembly is an optical fiber 503 held by a ferrule 502. The fiber 503 is optically coupled with the photonic device 504. In the depicted embodiment, the ferrule 502 includes a spacer 507 (also referred to as a foot). The spacer 507 is configured such that when the ferrule 502 is positioned on the support 501, the face of the fiber 503 is positioned at a desired distance from the photonic device 504. The precise nature of this distance is determined by a variety of factors known to those having ordinary skill in the art. These include, but are not limited to, the optical characteristics of the fiber and lens (if any). Although the optical element 505 is shown here mounted to the photonic device 504, it can be mounted on any component as long as the optical element 505 is positioned between the photonic device 504 and the fiber 503. For example, optical elements 505 can be positioned on the ferrule 502 of the support 501. Additionally, the optical element 505 can be integrated into the fiber 503 itself. Although not required to practice the invention, in some embodiments, all of the aforementioned components can be enclosed in a plug housing. In discussing the embodiment of FIG. 5(a) (and others), it becomes apparent that one advantage of such an embodiment is that all optical alignment is conducted during manufacturing. Thus, these embodiments do not suffer from optical misalignment problems during plugging in or when bumped or jostled by a user. Thus, the described embodiment avoids many of the prior art alignment problems.

FIG. 5(b), is a simplified view of a support embodiment having photonic devices formed thereon. The support 501' has a substrate 504' formed thereon. The support 501' can be formed of a wide range of materials including, but not limited to polyethylene ether ketone (PEEK), liquid crystal polymer (LCP), polyphenylene sulfide (PPS), ceramic (e.g., $Al_2O_3$), silicon, or other materials. The substrate 504' can also be formed of many different materials including, but not limited to gallium arsenide (GaAs) or indium gallium arsenide (InGaAs). One preferred material is GaAs. Photonic devices 511 are formed on (or as part of) the substrate 504', for example, using conventional semiconductor fabrication techniques. The photonic devices 511 can be formed of GaAs or InGaAs as well as other materials. The photonic devices 511 can include a single laser or detector or multiple arrays of such emitters and/or detectors. In one example, the photonic devices 511 are arrays of vertical cavity surface emitting lasers (VCSEL's). Electrically conductive bonding pads 513 are formed and electrically connected to the photonic devices 511 using conductive interconnect lines 512. The electrical connections can be used to form, for example, anodes. Further bonding pads 514 are also formed on the support 501'.

FIG. 5(c) is a section view of the embodiment depicted in FIG. 5(b), as taken across line A–A'. Wire bonding connections 515 are shown connecting the conductive bonding pads 513 of the substrate 504' to the bonding pads 514 of the support 501'. Also shown is the die attach pad interconnection 520 between the bottom on the substrate 504' and the top of the support 501'. The photonic device 511 is electrically connected to the die attach pad interconnection 520 through the back side of the substrate 504'. A via 522 is shown in the support 501' for electrically connecting the die attach pad interconnection 520 to an underlying electrical connector 506'. In one example, electrical connector 506' corresponds to a cathode for the photonic device 511. The support 501' can include another via 523 for electrically connecting the bonding pad 514 to an underlying electrical connector 506". In one example, electrical connector 506" corresponds to an anode for the photonic device 511. The electrical connectors 506' and 506" can be formed of a wide range of electrical connectors including, but not limited to, solder balls, conductive pins, "pogo pins", and many others. It will be appreciated by one having ordinary skill in the art that a wide variety of electrical interconnection methods and techniques can be used to establish electrical connections between the various electrical components and particularly between the photonic devices and the electrical connectors.

Figure 6A:
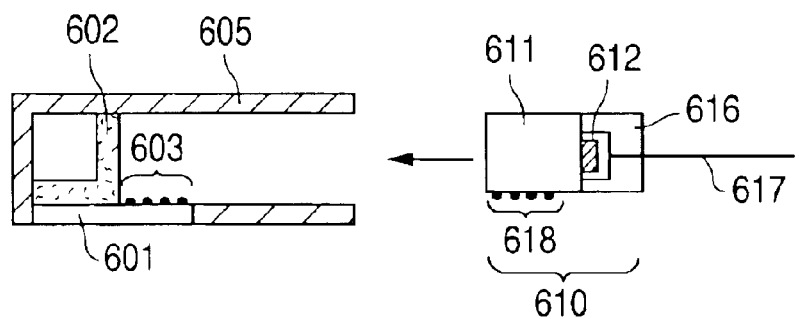
FIGS. 6(a) and 6(b) are section views of another simplified embodiment for a connector sleeve and connector plug for electrically interconnecting a CSA with photonic devices mounted on the connector plug in accordance with the principles of the present invention.
Figure 6B:
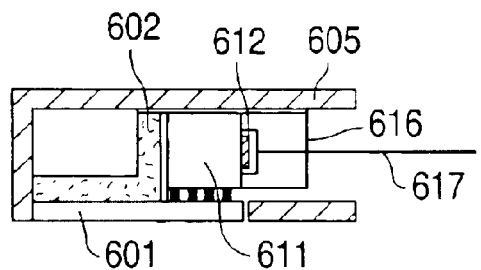
Figure 6C:
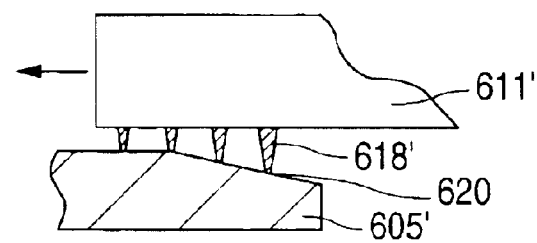
FIG. 6(c) is a close up view of a portion of the embodiments of FIGS. 6(a) and 6(b) showing the interface between the connector plug and a connector sleeve constructed in accordance with the principles of the present invention.

FIGS. 6(a)–6(c) depict another approach for electrically connecting an OSA to a CSA. FIG. 6(a) depicts a CSA 601 arranged inside a connector sleeve 605. The CSA 601 can be bonded to any appropriate support structure (e.g., a circuit board, not shown here). A backing block 602 is mounted on the CSA 601. Here, an L-shaped embodiment of the backing block 602 is shown. In the depicted embodiment the electrical connections are not mounted on the backing block 602. Here, the electrical connections 603 are arranged on the CSA 601.

A connector plug 610 includes an integrated optoelectronic component including an optical fiber 617 held by a ferrule 616 such that the fiber 617 is optically coupled with a photonic device 612 arranged on a support 611. The support 611 includes a plurality of electrical connectors 618 that are electrically connected with the photonic devices 612. As indicated, the connector plug 610 is inserted (as indicated by the arrow) into the connector sleeve 605 electrically connecting the electrical connections 603 of the CSA 601 to the electrical connectors 618 of the support 611, thereby establishing electrical connections between the photonic devices 612 and the CSA 601.

FIG. 6(b) shows the interconnected plug 610 and sleeve 605. In such an implementation, the backing block 602 functions as an alignment feature. The backing block 602 is configured such that when it contacts the support 611 the electrical connections 603 of the CSA 601 are aligned with the electrical connectors 618 of the support 611, thereby establishing electrical connections between the photonic devices 612 and the CSA 601. Alternatively, the inside of the sleeve 605 can be configured to appropriately align the plug 610.

FIG. 6(c) depicts a portion of the sleeve 605' and the plug (indicated here by a portion of the support 611') as they are being engaged. The electrical connectors 618 contact an inclined surface 620 of the sleeve 605' as the connector plug 610 is fitted into the sleeve 605'. The inclined surface 620 gently pushes the electrical connectors 618' upward during insertion, thereby preventing the electrical connectors 618' from being sheared off during insertion. Although the electrical connectors 618' are depicted here as retractable spring-loaded electrical contact pins (e.g., "pogo pins"), the inclined surface 618' can be used with most types of electrical connectors. In particular, solder balls can form the electrical connectors of the plug and corresponding small depressions or holes can be located in the CSA. The small depressions or holes include electrically conducting springs that contact the solder balls to form electrical connections when in correct alignment. Alternatively, the solder balls can be formed on the CSA and the small depressions or holes with conducting springs can be formed on the plug.

Figure 7A:
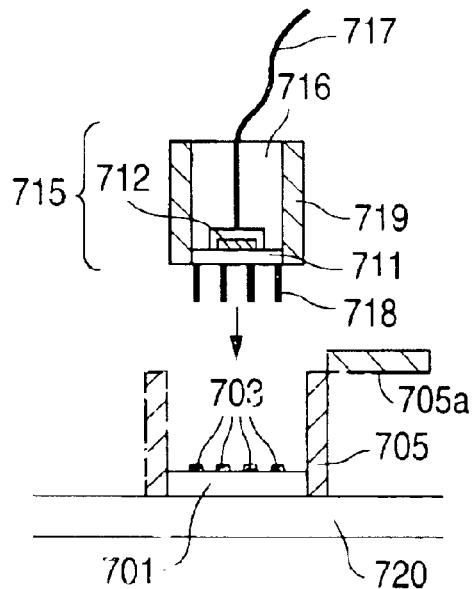
FIGS. 7(a) and 7(b) are section views of a simplified embodiment for a "top entry" connector sleeve and connector plug in accordance with the principles of the present invention.
Figure 7B:
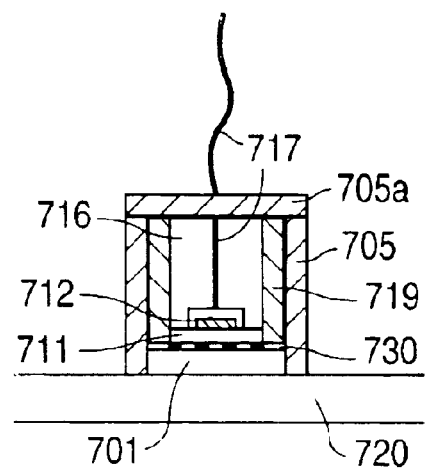

FIGS. 7(a) and 7(b) depict another approach for electrically connecting an OSA to a CSA. FIG. 7(a) depicts a CSA 701 mounted on a circuit board 720 and arranged inside a connector sleeve 705. In this embodiment, no backing block is required. Electrical connections 703 are arranged on top of the CSA 701. A latching mechanism 705a is also depicted. Into this CSA 701 sleeve 705 combination is inserted a connector plug 715.

The connector plug 715 includes an integrated optoelectronic component including an optical fiber 717 held by a ferrule 716 such that the fiber 717 is optically coupled with photonic devices 712 arranged on a support 711. The support 711 includes a plurality of electrical connectors 718 that are electrically connected with the photonic devices 712. Although in the depicted embodiment the electrical connectors 718 are retractable spring-loaded electrical contact pins, many other types of electrical contacts can be used. In the depicted embodiment, the aforementioned components are mounted in a connector plug housing 719. The connector plug 715 is inserted (as indicated by the arrow) into the connector sleeve 705 electrically connecting the electrical connections 703 of the CSA 701 to the electrical connectors 718 of the support 711, thereby establishing electrical connections between the photonic devices 712 and the CSA 701. FIG. 7(*b*) shows the electrical interconnection 730 between CSA 701 and the photonic devices 712. The plug 715 can be secured in the connector sleeve 705 by engaging the latch 705*a*. It should be noted that many other latches and methods for securing the plug to the connector sleeve 705 are known to those having ordinary skill in the art.

Figure 8A:
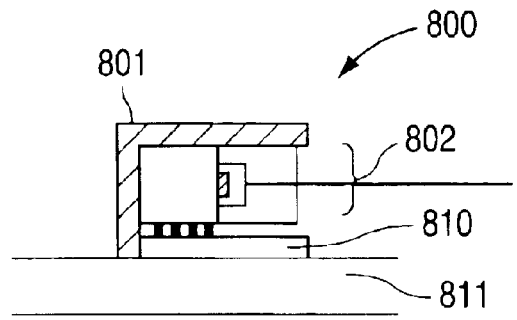
FIGS. 8(a)–8(c) are depictions of a reduced size connector apparatus used for inland connector applications.
Figure 8B:
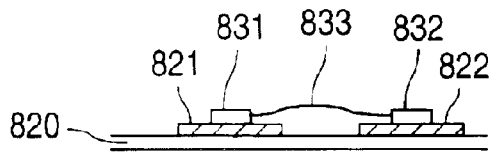
Figure 8C:
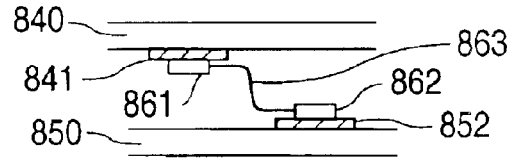

Another implementation of the invention is illustrated in FIGS. 8(*a*)–8(*c*). FIG. 8(*a*) is a section view of a simplified connector embodiment 800. This embodiment is used to make so-called inland connections (explained in greater detail hereinbelow). Edge mounted connectors require heavily built robust connectors capable of withstanding a certain amount of mechanical stress. Connectors that connect from one interior computer component to another interior computer component are subject to much less wear and tear and can be less robustly built. Moreover, in order to fit inside the cramped inner spaces of a computer it is advantageous that such connectors be smaller. The sleeve 801 depicted in FIG. 8(*a*) is very small, just enough room to accommodate the size of a connector plug 802. The sleeve 801 can be sized such that it just covers a CSA 810. Here, the CSA is shown mounted to a circuit board 811. The plug 802 can be configured similarly to the connector plugs described and detailed hereinabove. The configurations shown and discussed in FIGS. 6(*a*)–6(*c*) and 7(*a*)–7(*b*) are especially suited to such applications.

Such embodiments can be used to connect various devices mounted, for example, on the same circuit board. FIG. 8(*b*) shows a circuit board 820 having mounted thereon, a first device 821 and a second device 822. A first connector 831 is connected to the first device 821 and a second connector 832 is connected to the second device 822. The first connector 831 and the second connector 832 are optically interconnected by optical fibers 833. One advantage of such a configuration is that devices connected in this manner can take advantage of the extremely high data transmission rates possible with optical fibers.

FIG. 8(*c*) shows another implementation of the principles of the present invention. Devices mounted on separate boards can also be connected by the connectors of the present invention. A first circuit board 840 has a first device 841 mounted thereon. Also, a second circuit board 850 has a second device 852 mounted thereon. A first connector 861 is connected to the first device 842 and a second connector 862 is connected to the second device 852. The first connector 861 and the second connector 862 are optically interconnected by optical fibers 863. Many different devices can be interconnected in this manner. One particularly advantageous implementation includes, but is not limited to connecting a memory device to a microprocessor. Many other implementations of the present invention can be appreciated by a person having ordinary skill in the art.

Figure 9:
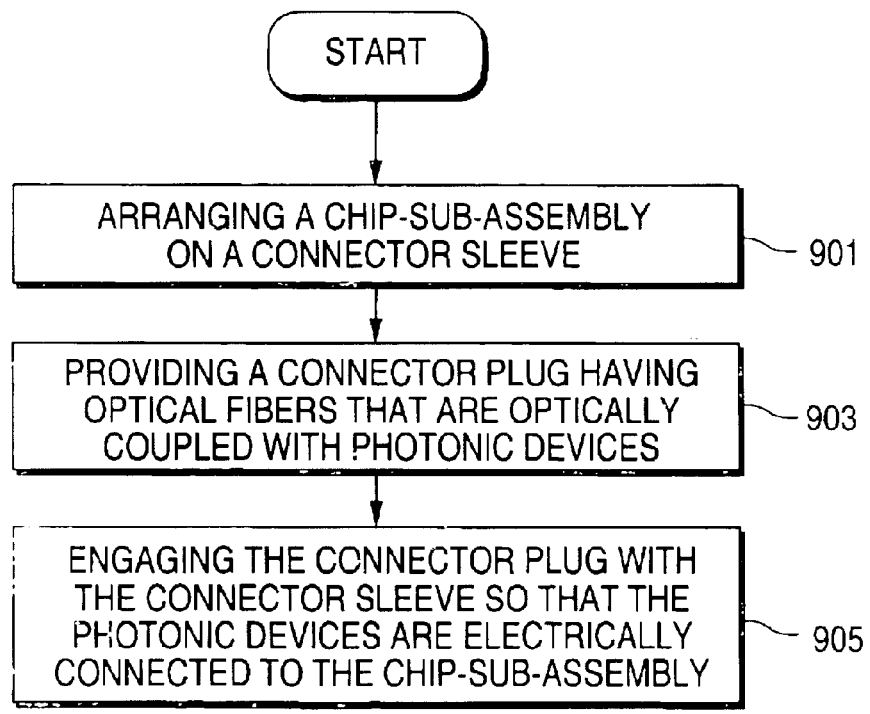
FIG. 9 is a flow diagram illustrating a method of positioning an optical fiber relative to a corresponding photonic device in accordance with the principles of the present invention.

FIG. 9 is a flow diagram that illustrates a method of electrically interconnecting a chip sub-assembly to photonic devices of an optical sub-assembly. One method embodiment comprises the steps of arranging a chip-subassembly having electrical connections on a connector sleeve (Step 901). The sleeve being configured to receive a connector plug. A connector plug is provided having optical fibers that are optically coupled with photonic devices having electrical connectors (Step 903). The connector plug is engaged with the connector sleeve so that the electrical connectors of the photonic devices are in electrical contact with the electrical connections of the chip-sub-assembly thereby electrically connecting the photonic devices with the chip sub-assembly (Step 905).

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. In particular, embodiments including various latching and locking mechanisms for securing the connector plug to the connector sleeve are specifically contemplated. Additionally, the inventors contemplate a wide range of alignment features for insuring that satisfactory electrical connections are made between the connector plug and connector sleeve. Such alignment features can include, but are not limited to pin and hole alignment features, tab and groove alignment features, and other related embodiments. Also, the photonic devices of the embodiments can refer to one or many photonic devices including arrays of photonic devices. The same can be said for the optical elements and electrical connectors which can also be arranged in arrays. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more".

What is claimed is:

1. An apparatus for electrically interconnecting a chip sub-assembly to photonic devices of an optical sub-assembly, the apparatus comprising:

a connector sleeve suitable for receiving a connector plug, the connector sleeve being arranged to carry a chip sub-assembly including at least one electrical connection for establishing an electrical connection between electrical connectors of an optical sub-assembly mounted on a connector plug, wherein the optical sub-assembly includes an optical fiber arranged in a desired alignment with a photonic device of the optical sub-assembly.

2. An apparatus as in claim 1, wherein the connector sleeve includes an alignment feature that operates to align and position the connector plug as it is received by the connector sleeve so that the electrical connections of the chip sub-assembly can establish an electrical connection with electrical connectors of the optical sub-assembly.

3. An apparatus as in claim 1, wherein the chip sub-assembly has mounted thereon, a backing block configured to act as a forward stop for a connector plug received by the connector sleeve.

4. An apparatus as in claim 3, wherein the backing block includes electrical contact pads that are electrically connected to the at least one electrical connection of the chip sub-assembly, the contact pads being arranged to provide said electrical connection to the electrical connectors of the optical sub-assembly when the connector plug is engaged by the connector sleeve.

5. An apparatus as in claim 4, wherein at least one of the contact pads includes an alignment opening configured to receive an alignment pin mounted on the optical sub-assembly so that when the alignment pin is engaged with the alignment opening of the backing block, each electrical connector of the optical sub-assembly is in electrical contact with a corresponding electrical contact pad of the backing block.

6. An apparatus-for electrically interconnecting a chip sub-assembly to a photonic device of an optical sub-assembly, the apparatus comprising:

a connector plug suitable for engagement with a connector sleeve, the connector sleeve containing a chip sub-assembly, the connector plug containing:

an optical sub-assembly including at least one photonic device and electrical connectors electrically connected to the at least one photonic device for electrically connecting the photonic device to the chip sub-assembly arranged on the connector sleeve when the connector plug is engaged with the connector sleeve; and at least one optical fiber optically coupled to a corresponding photonic device of the optical sub-assembly.

7. An apparatus as in claim 6, wherein an optical element is arranged between each optical fiber and the corresponding photonic device facilitating the optical coupling of each optical fiber to its corresponding photonic device of the optical sub-assembly.

8. An apparatus as in claim 6, wherein the optical sub-assembly includes a ferrule that holds the at least one optical fibers; and wherein optical sub-assembly includes a support having a first side and a second side, the first side having the at least one photonic device formed thereon and the second side having formed thereon electrical connectors that are electrically connected to the photonic devices; and wherein the support is arranged on the ferrule so that each photonic device is optically coupled with a corresponding optical fiber of the ferrule.

9. An apparatus as in claim 8, wherein electrical connectors on the second side of the support comprise spring-loaded electrical connectors.

10. An apparatus as in claim 8, wherein an optical element is arranged between each photonic device and its corresponding optical fiber, thereby facilitating optical coupling between the photonic device and the corresponding optical fiber.

11. An apparatus as in claim 8, wherein the ferrule includes a spacer configured such that when the support is arranged on the ferrule in contact with the spacer each photonic device is positioned at a desired optical distance from its optical fiber.

12. An apparatus as in claim 6, wherein the connector plug includes an alignment feature that operates to align and position the connector plug as it is received by the connector sleeve so that the electrical connections of the chip sub-assembly can establish an electrical connection with electrical connectors of the optical sub-assembly.

13. A connector apparatus for electrically interconnecting a chip sub-assembly to an optical sub-assembly, the apparatus comprising:

a connector sleeve suitable for receiving a connector plug, the connector sleeve having a chip sub-assembly arranged thereon and including at least one electrical connection to the chip sub-assembly;

a connector plug suitable for engagement with the connector sleeve, the plug containing:

an optical fiber;

an optical sub-assembly including a photonic device that is optically coupled to the optical fiber; and electrical connectors corresponding to each photonic device; and the connector plug is engaged with the connector sleeve to electrically interconnect the electrical connections of the chip sub-assembly to the electrical connectors of the optical sub-assembly such that electrical signals can pass between the chip sub-assembly and a photonic device of the optical sub-assembly.

14. An apparatus as in claim 13, wherein the connector sleeve includes an alignment feature that operates to align and position the connector plug as it is received by the connector sleeve so that the electrical connections of the chip sub-assembly can establish an electrical connection with electrical connectors of an optical sub-assembly.

15. An apparatus as in claim 13, wherein the chip sub-assembly has mounted thereon a backing block configured to act as a forward stop for the connector plug when it is engaged with the connector sleeve.

16. An apparatus as in claim 15, wherein the backing block includes electrical contact pads that are electrically connected to the at least one electrical connection of the chip sub-assembly, the contact pads being arranged to provide said electrical connection to the electrical connectors of the optical sub-assembly when the connector plug is engaged by the connector sleeve.

17. An apparatus as in claim 16, wherein the electrical connectors of the optical sub-assembly of the connector plug include spring-loaded electrical connector pins that contact the electrical contact pads of the backing block when the connector plug is engaged with the connector sleeve, thereby providing the electrical connection between the photonic device of the optical sub-assembly and the chip sub-assembly when the connector plug is engaged by the connector sleeve.

18. An apparatus as in claim 16, wherein the electrical connectors of the optical sub-assembly of the connector plug include alignment pins; and wherein the electrical contact pads of the backing block include alignment openings configured to engage the alignment pins of the optical sub-assembly as the connector plug is engaged with the connector sleeve, the engagement of the alignment openings with the alignment pins of the optical sub-assembly is designed to insure the electrical connection of the chip subassembly with the optical sub-assembly when the connector plug is engaged by the connector sleeve.

19. An apparatus as in claim 13, wherein the electrical connectors of the optical sub-assembly of the connector plug include spring-loaded electrical connector pins configured to electrically connect with the electrical connections of the chip subassembly when the connector plug is engaged with the connector sleeve, thereby providing the electrical connection between the photonic device of the optical sub-assembly and the chip sub-assembly when the connector plug is engaged by the connector sleeve.

20. A connector apparatus as in claim 13 wherein the connector plug includes a ferrule for holding the optical fiber;

a support having formed thereon the photonic device having electrical connections;

the support being arranged on the ferrule such that the photonic device is positioned at a desired distance from and having a desired alignment with respect to the optical fiber; and wherein, when the connector plug is engaged with the connector sleeve, the electrical connections of the chip sub-assembly are electrically connected to the to the electrical connectors of the support such that electrical signals can pass between the chip sub-assembly and a photonic device of the optical sub-assembly.

21. A method for electrically interconnecting a chip sub-assembly to photonic devices of an optical sub-assembly, the method comprising the steps of:

arranging a chip-sub-assembly having electrical connections on a connector sleeve configured to receive a connector plug;

providing a connector plug having optical fibers that are optically coupled with photonic devices having electrical connectors; and engaging the connector plug with the connector sleeve so that the electrical connectors of the photonic devices are in electrical contact with the electrical connections of the chip-sub-assembly thereby electrically connecting the photonic devices with the chip sub-assembly.

* * * * *

UNITED STATES PATENT AND TRADEMARK OFFICE
CERTIFICATE OF CORRECTION

PATENT NO.     : 6,802,654 B1
DATED          : October 12, 2004
INVENTOR(S)    : Roberts et al.

It is certified that error appears in the above-identified patent and that said Letters Patent is hereby corrected as shown below:

Column 1,
Line 50, change "modem computer" to -- modern computer --.

Column 2,
Line 6, change "Sunitomo" to -- Sumitomo --.

Signed and Sealed this

Nineteenth Day of April, 2005

JON W. DUDAS
*Director of the United States Patent and Trademark Office*